US012690306B2

(12) United States Patent
Yamashita

(10) Patent No.: US 12,690,306 B2
(45) Date of Patent: Jul. 21, 2026

(54) LIGHT-EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 464 days.

(21) Appl. No.: 18/447,299

(22) Filed: Aug. 9, 2023

(65) Prior Publication Data

US 2024/0063349 A1     Feb. 22, 2024

(30) Foreign Application Priority Data

Aug. 22, 2022     (JP) ................................. 2022-132045

(51) Int. Cl.
H10H 20/841        (2025.01)
H10H 20/85         (2025.01)
H10H 20/851        (2025.01)

(52) U.S. Cl.
CPC ...... H10H 20/841 (2025.01); H10H 20/8506 (2025.01); H10H 20/8515 (2025.01)

(58) Field of Classification Search
None
See application file for complete search history.

(56) References Cited

U.S. PATENT DOCUMENTS

2007/0152230 A1* 7/2007 Duong .................. H10F 39/804
                                                            257/E33.072
2013/0329397 A1* 12/2013 Shimizu ................... F21V 7/26
                                                            362/84

2016/0091712 A1      3/2016  Egawa et al.
2016/0327717 A1*   11/2016  Hashiya ............... G02B 6/0056
2018/0317757 A1    11/2018  Hayashi
2020/0064721 A1      2/2020  Shimizu et al.
2023/0014812 A1*    1/2023  Motobayashi ..... H10H 20/8515
2023/0042488 A1      2/2023  Tajiri

FOREIGN PATENT DOCUMENTS

JP        2006-337923  A     12/2006
JP        2013-254889  A     12/2013
JP        2015-022954  A      2/2015
JP        2016-061853  A      4/2016
(Continued)

*Primary Examiner* — Feifei Yeung Lopez

(74) *Attorney, Agent, or Firm* — Spencer Fane LLP

(57)                    ABSTRACT

A light-emitting device includes first and second light-emitting elements, an optical member, and a wavelength conversion member. The optical member includes an optical action layer configured to reflect or transmit light in accordance with a wavelength of the light. The optical action layer is configured to reflect first emission light emitted from the first light-emitting element and second emission light emitted from the second light-emitting element. The wavelength conversion member is configured to receive the first emission light reflected by the optical action layer of the optical member, to convert a wavelength of the first emission light, and to emit a wavelength-converted light having a converted wavelength. The optical action layer of the optical member is configured to transmit the wavelength-converted light. The optical member is arranged so that the wavelength-converted light and the second emission light are emitted from an upward-facing surface of the optical action layer.

16 Claims, 7 Drawing Sheets

(56)  References Cited

FOREIGN PATENT DOCUMENTS

| | | | |
|---|---|---|---|
| JP | 2016-070947 | A | 5/2016 |
| JP | 2018-190594 | A | 11/2018 |
| JP | 2020-030357 | A | 2/2020 |
| JP | 2021-103734 | A | 7/2021 |
| WO | 2011/131946 | A1 | 10/2011 |
| WO | 2021/125078 | A1 | 6/2021 |
| WO | WO2021131946 | A1 * | 7/2021 |

* cited by examiner

LIGHT-EMITTING DEVICE

CROSS-REFERENCE TO RELATED APPLICATIONS

This application is based upon and claims the benefit of priority from Japanese Patent Application No. 2022-132045, filed on Aug. 22, 2022, the entire contents of which are incorporated herein by reference.

BACKGROUND

The present disclosure relates to a light-emitting device.

A semiconductor light-emitting element such as a semiconductor laser (LD) or a light-emitting diode (LED) is used as a light source for an on-vehicle headlight, illumination, or the like. For example, Japanese Patent Publication No. 2021-103734 discloses a light-emitting device including a semiconductor laser, a reflective member and a phosphor, and configured to emit mixed-color light formed of light by a semiconductor laser element and fluorescence by the phosphor. There is also disclosed a light-emitting device in which light-emitting units each including a semiconductor laser, a reflective member, and a phosphor face each other.

SUMMARY

A light-emitting device according to an embodiment of the present invention includes a first light-emitting element, a second light-emitting element, an optical member, and a wavelength conversion member. The first light-emitting element includes a first light-emitting surface from which first emission light of a first emission color is emitted. The second light-emitting element includes a second light-emitting surface from which second emission light of a second emission color is emitted. The optical member includes an optical action layer configured to reflect or transmit light in accordance with a wavelength of the light. The optical action layer is configured to reflect the first emission light and the second emission light so that the first emission light and the second emission light do not pass through the optical action layer. The wavelength conversion member is configured to receive the first emission light reflected by the optical action layer of the optical member, to convert a wavelength of the first emission light, and to emit a wavelength-converted light having a converted wavelength. The optical action layer of the optical member is configured to transmit the wavelength-converted light. The optical member is arranged so that the wavelength-converted light and the second emission light are emitted from an upward-facing surface of the optical action layer.

In the light-emitting device according to the embodiment described above, a light-emitting element is divided into the first light-emitting element for wavelength conversion and the second light-emitting element for the second emission light, and the light output from these light-emitting elements is controlled by one optical member, thereby making it possible to provide a compact light-emitting device.

BRIEF DESCRIPTION OF THE DRAWINGS

FIG. 3 is a schematic cross-sectional view of an optical member in FIG. 1.

FIG. 4 is another schematic cross-sectional view of the optical member in FIG. 1.

DETAILED DESCRIPTION

Figure 1:
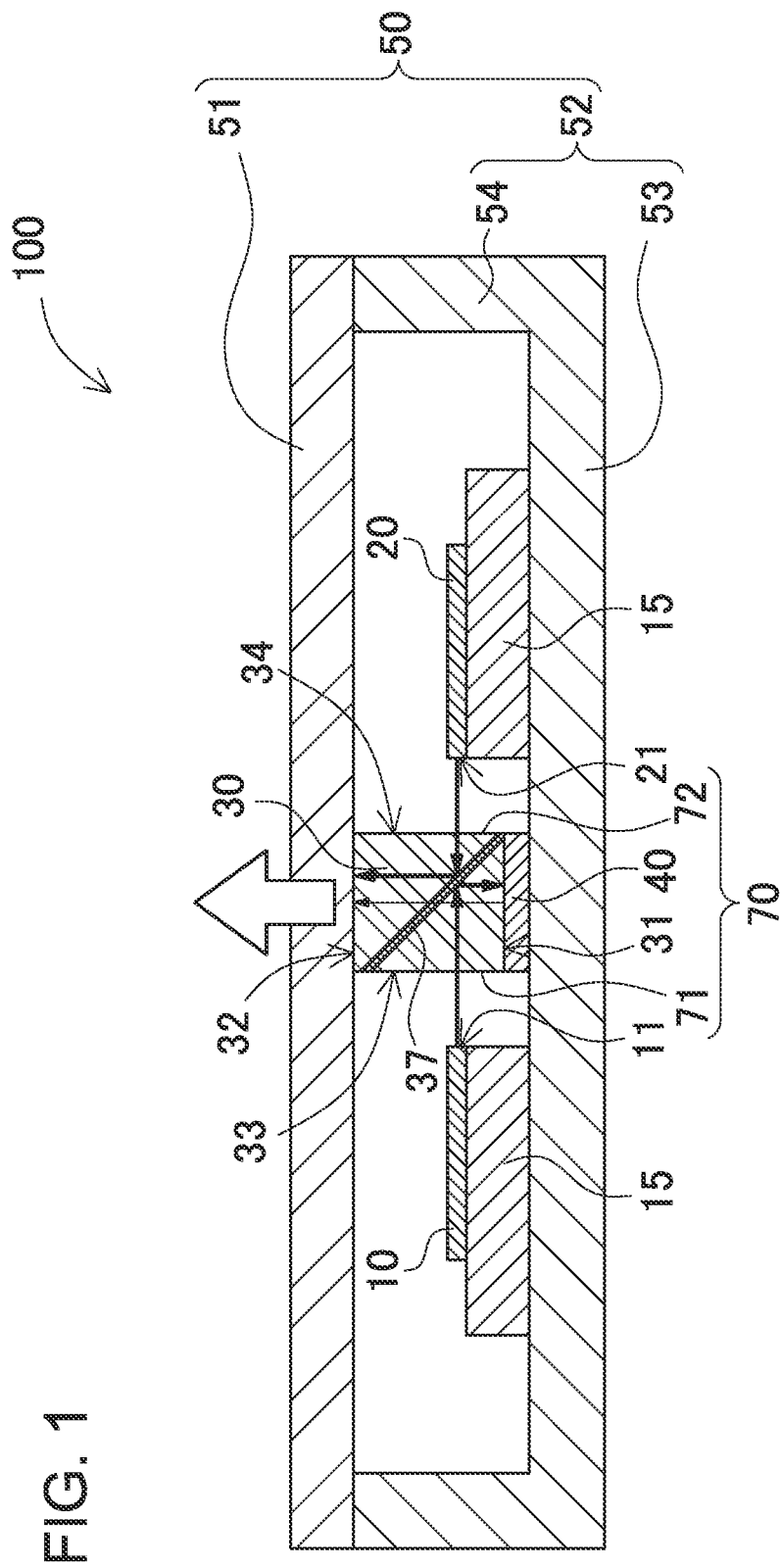
FIG. 1 is a schematic cross-sectional view illustrating a light-emitting device according to a first embodiment of the present invention.

In this description or the scope of the claims, polygons such as triangles and quadrangles, including shapes with modifications at corners of the polygon, such as rounded corners, slanted corners, inverse-rounded corners, and corners rounded, are referred to as polygons. Furthermore, a shape obtained by processing not only the corners (ends of sides), but also an intermediate portion of a side is similarly referred to as a polygon. That is, a shape that is partially processed while retaining a polygon shape as a base is included in the interpretation of "polygon" described in this description and the scope of the claims.

The same applies not only to polygons but also to words representing specific shapes such as trapezoids, circles, protrusions, and recessions. The same applies when dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "strict quadrangle".

Further, in the description or the scope of the claims, descriptions such as upper and lower (upward/downward), left and right, surface and reverse, front and back (forward/backward), and near and far are used merely to describe the relative relationship of positions, orientations, directions, and the like, and the expressions need not necessarily match an actual relationship at the time of use.

Furthermore, in the description or the scope of the claims, when there are a plurality of components and each of these components is to be indicated separately, the components may be distinguished by adding the terms "first" and "second" at the beginning of the name of the component. Further, objects to be distinguished may differ between the description and the scope of the claims. Thus, even when a component in the scope of the claims is given the same term as that in the description, the object indicated by that component may not be the same across the description and the scope of the claims.

For example, when there are components distinguished by being denoted as "first", "second", and "third" in the present disclosure, and in a case in which components given the terms "first" and "third" in the present disclosure are described in the scope of the claims, these components may be distinguished by being denoted as "first" and "second" in the scope of the claims for ease of understanding. In this case, the components denoted as "first" and "second" in the scope of the claims refer to the components denoted as "first" and "third" in the present disclosure, respectively. Note that this rule is not limited to components and also applied to other objects in a reasonable and flexible manner.

Embodiments for implementing the present invention will be described below. Furthermore, specific embodiments for implementing the present invention will be described below with reference to the accompanying drawings. Note that embodiments for implementing the present invention are not limited to the specific embodiments. In other words, the illustrated embodiments are not the only form in which the present invention is implemented. Note that sizes, positional relationships, and the like of members illustrated in the drawings may sometimes be exaggerated in order to facili- tate understanding.

First Embodiment

FIG. 1 is a schematic cross-sectional view illustrating a light-emitting device according to a first embodiment. A light-emitting device 100 illustrated in the drawing includes a first light-emitting element 10, a wavelength conversion member 40, a second light-emitting element 20, and an optical member 30. The above-mentioned first light-emitting element 10, wavelength conversion member 40, second light-emitting element 20, and optical member 30 are housed in a package 50.

Package 50

The package 50 includes a base member 52 and a lid 51. The base member 52 is formed in a box shape with an upper surface opened. In the base member 52, a cavity houses one or more components such as the first light-emitting element 10 included in the light-emitting device 100. The base member 52 is preferably formed by using ceramics, metal, or the like that is excellent in heat dissipation as a material thereof. The opening end of the upper surface of the base member 52 is sealed by the lid 51. The lid 51 is a light-transmissive member such as sapphire or glass. In this case, the base member 52 is sealed by the lid 51. The package 50 is constituted by bonding the base member 52 and the lid 51 to each other. A closed space that is formed inside the package 50 is a sealed space. This internal space is a space sealed in an airtight state at a predetermined atmosphere.

The base member 52 has the upper surface and a lower surface. The external shape of the base member 52 is rectangular in a top view. This rectangular shape may be a rectangular shape with long sides and short sides. The external shape of the base member 52 in a top view may not be a rectangular shape. A rectangular shape may include a square shape unless specifically described as excluding a square shape.

The base member 52 has a mounting surface. For example, the upper surface of the base member 52 may serve as the mounting surface. Other components are mounted on the mounting surface.

The lid 51 has an upper surface and a lower surface. The lower surface of the lid 51 faces the upper surface of the base member 52. The lid 51 transmits light having a predetermined wavelength. The lid 51 has transmissivity from the lower surface across over the upper surface. Here, having transmissivity with respect to light having a predetermined wavelength means that the transmittance is 80% or greater with respect to light having the predetermined wavelength.

The base member 52 is constituted by a mounting substrate 53 and a frame member 54. The upper surface of the mounting substrate 53 forms the bottom surface of the cavity of the base member 52. The first light-emitting element 10, the optical member 30 bonded with the wavelength conversion member 40, and the second light-emitting element 20 are mounted on the upper surface of the mounting substrate 53. The upper surface of the mounting substrate 53 functions as the mounting surface. The frame member 54 constitutes a peripheral wall of the cavity.

The main material of the mounting substrate 53 is metal or a composite containing metal. For example, the main material of the mounting substrate 53 is copper. The main material of the frame member 54 is ceramics. For example, the main material of the frame member 54 is any of aluminum nitride, silicon nitride, and aluminum oxide. The main material of the lid 51 is any of quartz, silicon carbide, sapphire, and glass, for example.

Here, the main material refers to a material that occupies the greatest ratio of a target formed-product in terms of weight or volume. Note that, when a target formed-product is formed of one material, that material is the main material. In other words, when a certain material is the main material, the percentage of that material may be 100%.

The mounting substrate 53 and the frame member 54 may be integrally formed with the same material to constitute the base member 52. When the mounting substrate 53 is made of metal, the base member 52 excellent in heat dissipation is achieved, but the base member 52 is not limited thereto.

First Light-Emitting Element 10

The first light-emitting element 10 has a first light-emitting surface 11 for emitting light of a first emission color (hereinafter referred to as first emission light). The light of the first emission color excites the wavelength conversion member 40. The first light-emitting element 10 serves as an excitation light source for exciting the wavelength conversion member 40. A semiconductor light-emitting element such as a semiconductor laser (LD) or a light-emitting diode (LED) may be used for the first light-emitting element 10 discussed above. For example, the semiconductor light-emitting element is constituted by a chip on submount (CoS), where the semiconductor light-emitting element is mounted on a submount 15 in advance, and the CoS is mounted on the mounting surface of the package 50.

The wavelength conversion member 40 receives the first emission light from first light-emitting element 10 and emits light of a third emission color (hereinafter referred to as wavelength-converted light) whose wavelength is obtained by converting the wavelength of the first emission light to a wavelength different from that of the first emission light. A phosphor or the like may be suitably used for the above-mentioned wavelength conversion member 40 (details will be described later).

Second Light-Emitting Element 20

The second light-emitting element 20 emits second emission light of a second emission color. The second light-emitting element 20 has a second light-emitting surface 21 for emitting the second emission light. The second emission light is emitted to the outside without being wavelength-converted by the wavelength conversion member 40. At this time, light in which the second emission light and the wavelength-converted light are mixed is emitted. A semiconductor light-emitting element such as a semiconductor laser (LD) or a light-emitting diode (LED) may also be suitably used for the second light-emitting element 20 discussed above. Preferably, the semiconductor light-emitting element constituting the second light-emitting element 20 is constituted by a CoS, where the semiconductor light-emitting element is mounted on the submount 15 in advance, and the CoS is mounted on the package 50 at the same time with the first light-emitting element 10. At this time, in order to prevent deterioration due to heat, it is preferable to mount the CoS after mounting the optical member 30 in the package 50.

The first emission color of the first light-emitting element 10 and the second emission color of the second light-emitting element 20 are preferably emission colors of the same system. Since the optical design of an optical action layer 37 is unlikely to be complicated when the emission colors of the same system are used, the optical member 30 may be easily manufactured. Optical design in which a wavelength range for light transmission and a wavelength range for light reflection are separated from each other taking a certain specific wavelength as a boundary, and it is unnecessary to further provide another boundary at a different specific wavelength, may be cited as an example of the optical design that is not complicated. For example, both the first emission color and the second emission color are made to be blue. Further, by making the third emission color yellow, white light can be obtained by color mixing, and can be used for applications such as lighting and headlights.

A difference between main emission peak wavelengths of the first light-emitting element 10 and second light-emitting element 20 is preferably equal to or less than 20 nm. Hereinafter, when the first light-emitting element 10 and the second light-emitting element 20 are collectively described, they are referred to as the light-emitting elements.

The light emitted from the light-emitting elements is not limited to blue. The mixed-color light emitted from the light-emitting device 100 is also not limited to white light. For example, a light-emitting element that emits green light, a light-emitting element that emits red light, or the like may be employed. A light-emitting element that emits light of another color may be employed.

Blue light refers to light having an emission peak wavelength within a range from 420 nm to 494 nm. Green light refers to light having an emission peak wavelength within a range from 495 nm to 570 nm. Red light refers to light having an emission peak wavelength within a range from 605 nm to 750 nm. For example, light having an emission peak wavelength in a range from 430 nm to 480 nm is emitted from the light-emitting element.

A semiconductor laser element as an example of the light-emitting element will be described below. The semiconductor laser element has a rectangular external shape having one set of opposite sides as long sides and another set of opposite sides as short sides in a top view. Light (laser beam) emitted from the semiconductor laser element spreads. Further, divergent light is emitted from an emission end surface of the semiconductor laser element. The emission end surface of the semiconductor laser element may be referred to as a light-emitting surface of the light-emitting element.

The light emitted from the semiconductor laser element forms a far field pattern (hereinafter referred to as an "FFP") of an elliptical shape in a plane parallel to the emission end surface of the light. The FFP indicates a shape and a light intensity distribution of the emitted light at a position separated from the emission end surface. Here, light passing through the center of the elliptical shape of the FFP, in other words, light having a peak intensity in the light intensity distribution of the FFP is referred to as light traveling on an optical axis or light passing through an optical axis. Based on the light intensity distribution of the FFP, light having an intensity of $1/e^2$ or more with respect to a peak intensity value is referred to as a main portion of the light.

The shape of the FFP of the light emitted from the semiconductor laser element is an elliptical shape in which the length in a layering direction is longer than that in a direction perpendicular to the layering direction in the plane parallel to the emission end surface of the light. The layering direction is a direction in which a plurality of semiconductor layers including an active layer are layered in the semiconductor laser element. The direction perpendicular to the layering direction can also be referred to as a plane direction of the semiconductor layer. Further, a long diameter direction of the elliptical shape of the FFP can also be referred to as a fast axis direction of the semiconductor laser element, and a short diameter direction can also be referred to as a slow axis direction of the semiconductor laser element.

Based on the light intensity distribution of the FFP, an angle at which light having a light intensity of $1/e^2$ of a peak light intensity spreads is referred to as a divergence angle of light of the semiconductor laser element. For example, a divergence angle may also be determined based on the light intensity that is half of the peak light intensity in addition to being determined based on the light intensity of $1/e^2$ of the peak light intensity. In the description herein, the term "divergence angle" by itself refers to a divergence angle of light at the light intensity of $1/e^2$ of the peak light intensity. Note that it can be said that a divergence angle in the fast axis direction is greater than a divergence angle in the slow axis direction.

A semiconductor laser element with a divergence angle in the slow axis direction in a range from 2 degrees to 30 degrees may be employed for the light-emitting element. A semiconductor laser element with a divergence angle in the fast axis direction in a range from 5 degrees to 120 degrees may be employed for the light-emitting element.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 15

The submount 15 for mounting the light-emitting element on its upper surface has the upper surface and a lower surface. The submount 15 is formed in a rectangular parallelepiped shape. In a top view, the submount 15 has a rectangular external shape with long sides and short sides. The submount 15 has the smallest width in an up-down direction. The width of the submount 15 in the up-down direction may be in a range from 50 μm to 1000 μm. The shape of the submount 15 is not limited to the rectangular parallelepiped shape. The submount 15 may be formed using, for example, silicon nitride, aluminum nitride, or silicon carbide. Further, a metal film for bonding is provided on the bonding surface.

Optical Member 30

The optical member 30 is a wavelength selection reflection member that selectively reflects light in accordance with the wavelength. The optical member 30 includes the optical action layer 37 in the interior thereof. The optical action layer 37 varies reflectance and transmittance in accordance with the wavelength of light. The optical action layer 37 is obliquely disposed inside the optical member 30 while being oriented to face the first light-emitting surface 11 of the first light-emitting element 10 and the wavelength conversion member 40.

The external shape of the optical member 30 is formed with a box shape. The box-shaped optical member 30 includes a first surface 31, a second surface 32 on the opposite side to the first surface 31, a third surface 33, and a fourth surface 34 on the opposite side to the third surface 33 in a cross-sectional view as illustrated in FIG. 1. In the drawing, the lower surface of the optical member 30 corresponds to the first surface 31, the upper surface thereof corresponds to the second surface 32, the left surface thereof corresponds to the third surface 33, and the right surface thereof corresponds to the fourth surface 34. The wavelength conversion member 40 is disposed under the first surface 31. The first surface 31 of the optical member 30 is bonded to the wavelength conversion member 40. The wavelength conversion member 40 and the first surface 31 of the optical member 30 may be directly bonded to each other without using an adhesive, in addition to being bonded using an adhesive. For example, a reflective phosphor as one form of the wavelength conversion member 40 is bonded to the first surface 31 of a dichroic mirror as one form of the optical member 30 by surface activated bonding (SAB), atomic diffusion bonding (ADB), or the like. The optical member 30 integrated with the wavelength conversion member 40 in this manner is mounted in the package 50.

The third surface 33 faces the first light-emitting surface 11 of the first light-emitting element 10. The first emission light emitted from the first light-emitting element 10 is incident on the third surface 33. The fourth surface 34 faces the second light-emitting surface 21 of the second light-emitting element 20. The second emission light emitted from the second light-emitting element 20 is incident on the fourth surface 34. As described above, in FIG. 1, the first light-emitting element 10 and the second light-emitting element 20 are arranged in such a manner that the first light-emitting surface 11 and the second light-emitting surface 21 face each other with the optical member 30 being interposed therebetween.

Optical Action Layer 37

The optical action layer 37 is a part constituting the optical member 30. The optical action layer 37 extends obliquely with respect to the mounting surface. The optical action layer 37 may constitute the entire optical member 30. The optical action layer 37 is obliquely disposed inside the optical member 30 to face the first surface 31 and the third surface 33. The optical action layer 37 is obliquely disposed inside the optical member 30 to also face the second surface 32 and the fourth surface 34. In the optical action layer 37, a surface facing the first surface 31 and third surface 33 of the optical member 30 is referred to as a first optical action surface 38 (a lower left surface in FIG. 1), and on the back face side thereof, a surface facing the second surface 32 and fourth surface 34 of the optical member 30 is referred to as a second optical action surface 39 (an upper right surface in FIG. 1).

Preferably, in the interior of the optical member 30, the optical action layer 37 is inclined at an angle of 45 degrees with respect to the first surface 31 (a horizontal plane in FIG. 1) from a contact point between the first surface 31 and the fourth surface 34. Thus, the first optical action surface 38 of the optical action layer 37 is oriented to face both the first light-emitting element 10 and the wavelength conversion member 40, so that the first emission light that enters into the optical member 30 through the third surface 33 of the optical member 30 may be reflected at the first optical action surface 38 side toward the wavelength conversion member 40 disposed on the first surface 31. The first emission light is reflected by the optical action layer 37 without being transmitted therethrough. Alternatively, the optical action layer 37 reflects at least 90% or more of the first emission light. Alternatively, the optical action layer 37 reflects at least 95% or more of the first emission light. Alternatively, the optical action layer 37 reflects at least 99% or more of the first emission light.

In the present disclosure, the expression "reflected without being transmitted" may be understood as indicating a state that it is desirable to reflect all the light as much as possible. To be specific, in an attempt to raise emission efficiency of light emitted from the light-emitting device 100 as much as possible, even when it is unknown whether the optical action layer 37 is arranged and structured so as to desirably have a reflectance of 100%, the optical action layer 37 is provided being arranged and structured in such a manner as to preserve the meaning of presence of other configurations even when it is attempted to reflect all the light as much as possible. When the above understanding applies, a specific value of the reflectance is not so important, and for example, even when the reflectance is 80%, it may be said that this reflectance corresponds to a situation of "reflected without being transmitted".

The optical action layer 37 may be formed in the interior of the optical member 30, preferably in the form of a plate having a flat and smooth surface. For example, the optical action layer 37 may be formed by depositing a dielectric multilayer film by a thin film deposition technique such as sputtering on a surface (primary surface) obliquely formed across a transparent main body of the optical member 30 made of a transparent material such as glass or plastic that transmits visible light therethrough. The optical member 30 discussed above may be formed with, for example, a dichroic mirror or a prism.

Wavelength Conversion Member 40

The wavelength conversion member 40 receives the first emission light reflected by the optical action layer 37 and emits wavelength-converted light of a third emission color obtained by wavelength-converting the first emission color. Further, the wavelength-converted light is transmitted through the optical action layer 37. The wavelength-converted light is incident on the surface of the optical action layer 37 facing downward, passes through the optical action layer 37, and is emitted from the upward-facing surface of the optical action layer 37 that faces upward. The wavelength-converted light and the second emission light are emitted from the upward-facing surface of the optical action layer 37. For example, the optical action layer 37 transmits 80% or more of the wavelength-converted light therethrough. It is preferable that the wavelength-converted light be transmitted through the optical action layer 37 without being reflected. The expression "transmitted without being reflected" can be understood by replacing "reflected" with "transmitted" and "transmitted" with "reflected" in the expression "reflected without being transmitted" described above.

The wavelength conversion member 40 may include a phosphor. Examples of the phosphor include cerium-activated yttrium aluminum garnet (YAG), cerium-activated lutetium aluminum garnet (LAG), europium-activated silicate ((Sr, Ba)$_2$SiO$_4$), α-SiAlON phosphor, and β-SiAlON phosphor. Among them, the YAG phosphor has good heat resistance and is widely used in the case of emitting white light by color mixing.

The optical member 30 has a light extraction surface from which the wavelength-converted light and the second emission light are emitted. The second surface 32 of the optical member 30 serves as the light extraction surface. The second surface 32 faces the lid 51. The wavelength-converted light having passed through the optical action layer 37 from the wavelength conversion member 40 is emitted to the outside from the second surface 32. On the other hand, the optical action layer 37 reflects the second emission light that enters the optical member 30 through the fourth surface 34, at the second optical action surface 39 side toward the second surface 32. The second emission light is also reflected by the optical action layer 37 without being transmitted therethrough. By reflecting the second emission light directly toward the light extraction surface side in this way, it is unnecessary to allocate part of the second emission light to the excitation light of the wavelength conversion member 40, and the second emission light may be used for the emission light of the light-emitting device 100 without loss.

The emission light from the light extraction surface is observed as mixed-color light of the second emission light having the second emission color and the wavelength-converted light having the third emission color. For example, by selecting blue light as the first emission color and the second emission color, and selecting yellow light as the third emission color, a light-emitting device configured to emit white light as mixed-color light of these colors can be achieved. As described above, the light-emitting element serving as the light source of the light-emitting device is divided into the first light-emitting element 10 for the wavelength-converted light and the second light-emitting element 20 for the second emission light, thereby obtaining an advantage that the color adjustment can be carried out with ease.

Driver 60

Figure 2:
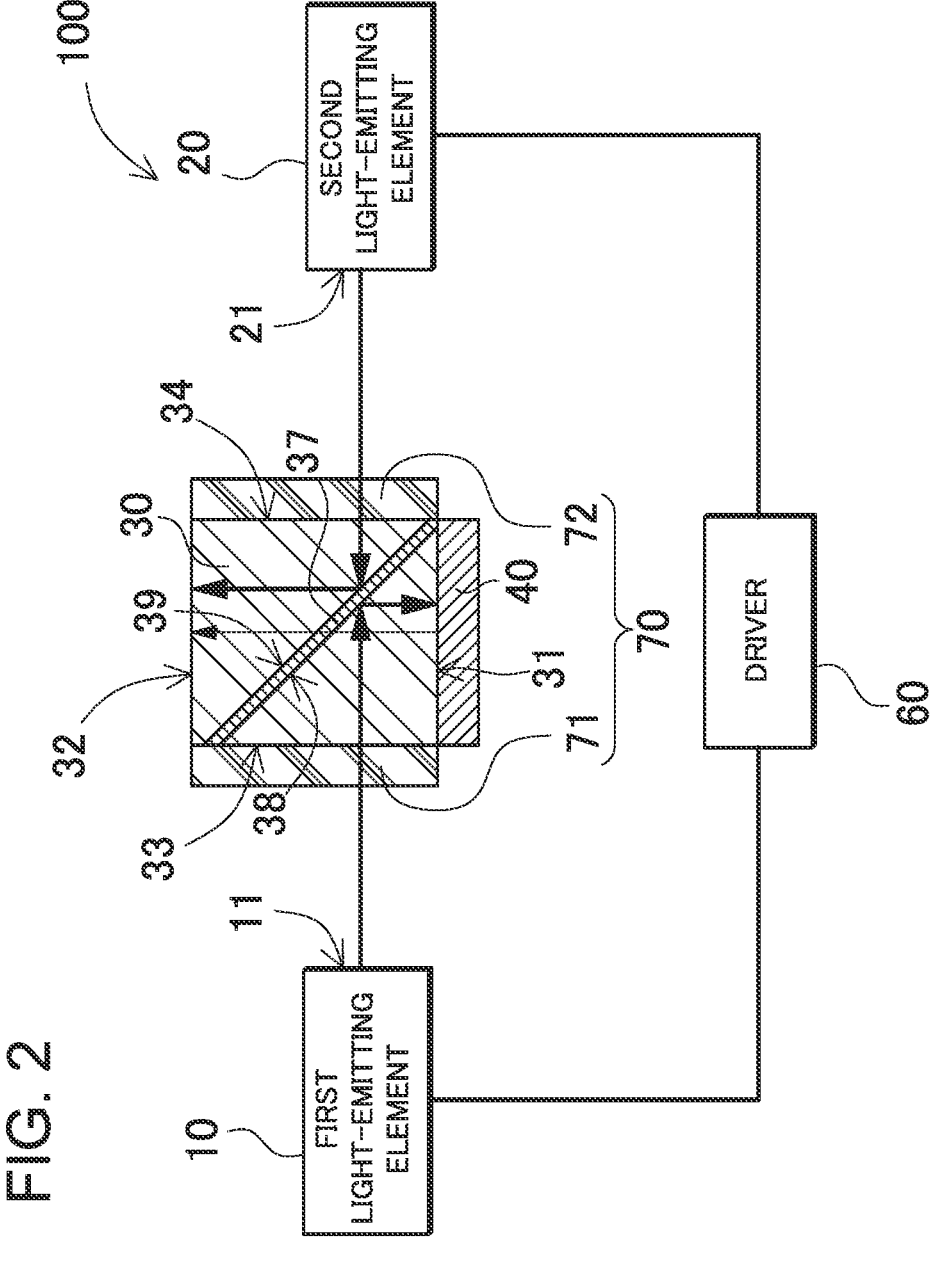
FIG. 2 is a block diagram of the light-emitting device in FIG. 1.

As illustrated in a block diagram in FIG. 2, the light-emitting device 100 includes a driver 60 (electrical circuit (s)), which can independently drive the first light-emitting element 10 and the second light-emitting element 20 for light emission. The driver 60 can independently control a first drive current and a second drive current for driving the first light-emitting element 10 and the second light-emitting element 20, respectively. For example, in the above-described example in which the first emission color and the second emission color are blue light and the third emission color is yellow light, the light amount balance between blue light and yellow light can be varied by increasing or decreasing the output of each of the first light-emitting element 10 and second light-emitting element 20, whereby chromaticity may be easily adjusted.

The second surface 32 serving as the light extraction surface of the optical member 30 may be provided with a rough-surface region. Then, the second emission light is emitted from the second surface 32 while passing through the rough-surface region. Thus, the output light may be diffused on the emission surface side of the optical member 30.

As illustrated in a cross-sectional view in FIG. 3, it is preferable that an upper end of the optical action layer 37 of the optical member 30 not intersect with the second surface 32 (i.e., the upper end of the optical action layer 37 is spaced apart from the second surface) but intersect with the third surface 33 below an upper end of the third surface 33. With this, a light path length of the optical member 30 may be lengthened and the output light with an expanded spot diameter may be emitted.

It is preferable that the optical action layer 37 of the optical member 30 reflect light in a blue light wavelength range and transmit light in a wavelength range longer than the blue light wavelength range. To be specific, it is preferable that the optical action layer 37 reflect at least light in a wavelength range from 430 nm to 480 nm and transmit at least light in a wavelength range equal to or greater than 500 nm.

Reflection-Transmission Film 70

The optical member 30 preferably includes a reflection-transmission film 70. The reflection-transmission film 70 has wavelength selectivity for reflecting the wavelength-converted light while transmitting the first emission light and the second emission light. As described above, the reflection-transmission film 70 has optical characteristics opposite to those of the optical action layer 37.

Figures 3, 4:
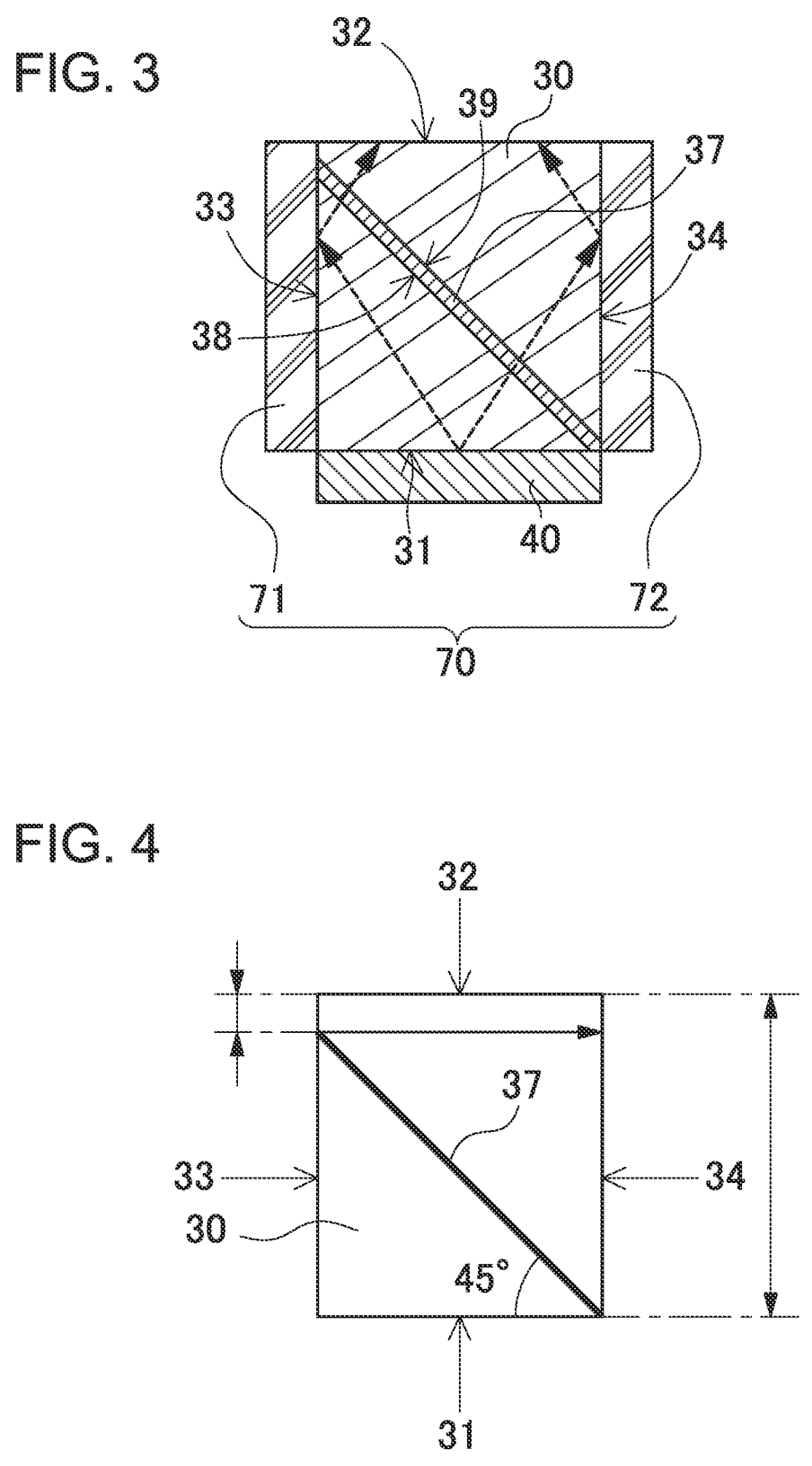

In an example illustrated in a cross-sectional view of FIG. 3, the reflection-transmission film 70 is provided on the third surface 33 and the fourth surface 34 of the optical member 30. A first reflection-transmission film 71 provided on the third surface 33 transmits the first emission light therethrough. The first reflection-transmission film 71 reflects the wavelength-converted light. On the other hand, a second reflection-transmission film 72 provided on the fourth surface 34 transmits the second emission light therethrough. The second reflection-transmission film 72 reflects the wavelength-converted light having passed through the optical action layer 37. The above-mentioned first reflection-transmission film 71 and second reflection-transmission film 72 may be formed of a dielectric multilayer film (DBR) or the like.

Reflective Film 80

The optical member 30 may be further provided with a reflective film 80 on part of a side surface thereof. This makes it possible to effectively use light that enters the optical member 30. In an example illustrated in a plan view of FIG. 5, the optical member 30 has a fifth surface 35 (lower side in the drawing) intersecting the first surface 31, the second surface 32, the third surface 33 and the fourth surface 34, and has a sixth surface 36 (upper side in the drawing) intersecting the first surface 31, the second surface 32, the third surface 33 and the fourth surface 34, and opposing the fifth surface 35. A first reflective film 81 is provided on the fifth surface 35. A second reflective film 82 is provided on the sixth surface 36. These first reflective film 81 and second reflective film 82 reflect the first emission light, the second emission light, and the wavelength-converted light. The first reflective film 81 and second reflective film 82 discussed above may be made of a reflective material having no wavelength selectivity, such as a metal film.

Second Embodiment

Figure 5:
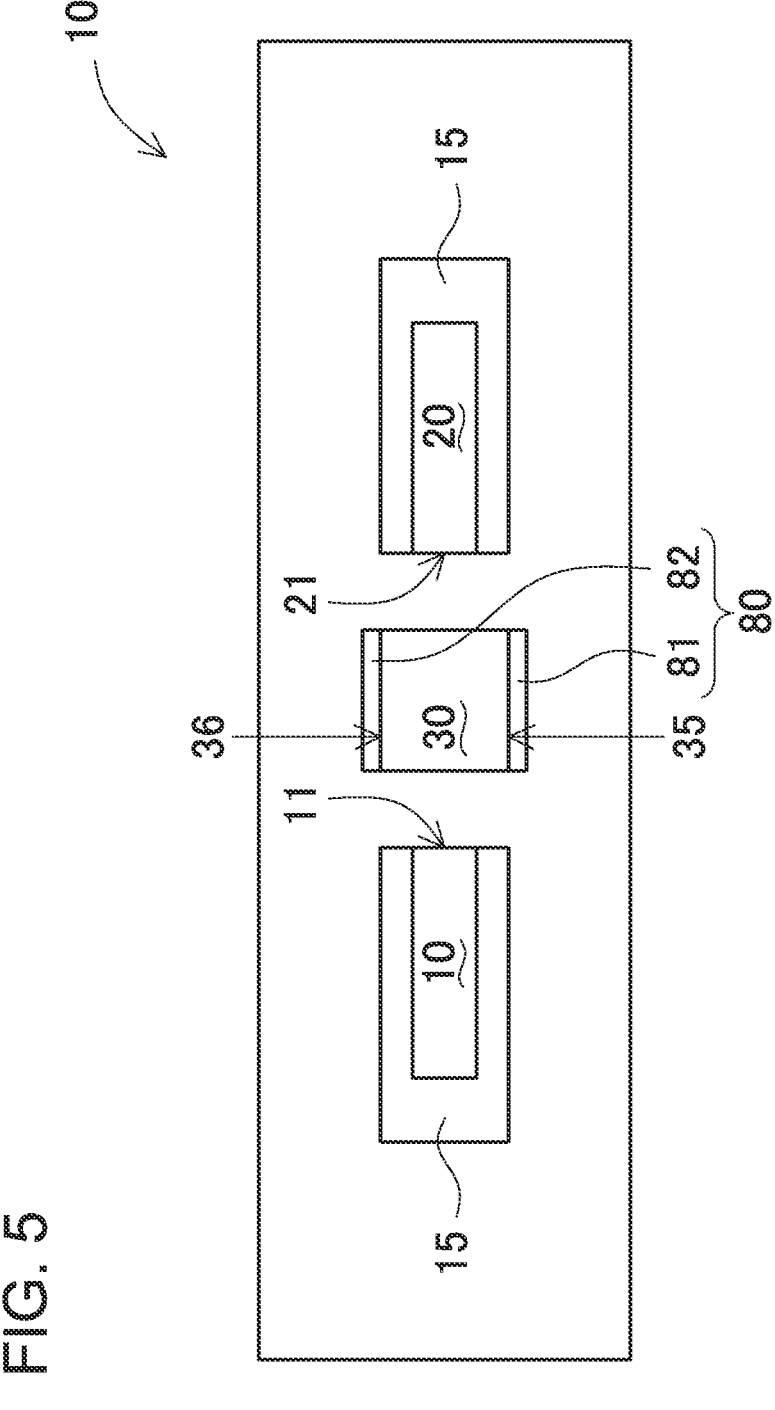
FIG. 5 is a plan view of the light-emitting device in FIG. 1.
Figure 6:
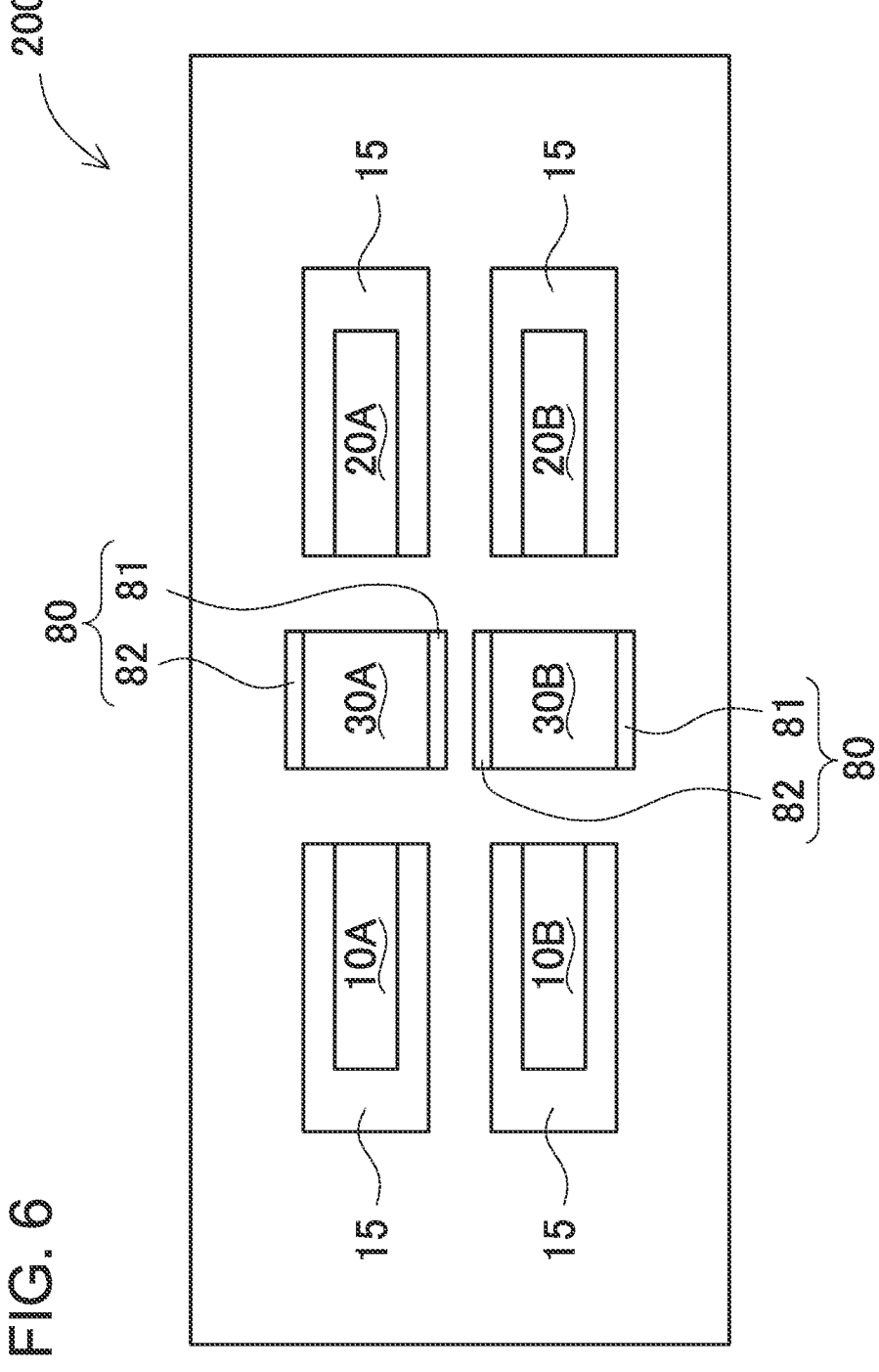
FIG. 6 is a plan view illustrating a light-emitting device according to a second embodiment of the present invention.

FIG. 5 describes the example in which one first light-emitting element 10, one optical member 30 bonded with the wavelength conversion member 40, and one second light-emitting element 20 are arranged linearly in one package. However, the present invention is not limited to this configuration, and pluralities of the above members may be arranged. For example, a plan view in FIG. 6 indicates an example of a light-emitting device 200 according to a second embodiment where two sets of configurations in each of which the first light-emitting element 10, the optical member 30 bonded with the wavelength conversion member 40, and the second light-emitting element 20 are arranged linearly are arranged in parallel to each other. In this drawing, the same members as those of the above-described first embodiment are denoted by the same reference signs, and detailed description thereof is omitted. By using a plurality of first light-emitting elements 10A and 10B, a plurality of optical members 30A and 30B each bonded with the wavelength conversion member 40, and a plurality of second light-emitting elements 20A and 20B in this manner, the amount of light may be increased. The emission colors of color-mixing output light of the two sets of configurations respectively including the first light-emitting elements 10A and 10B, the optical members 30A and 30B bonded with the wavelength conversion members, and the second light-emitting elements 20A and 20B may be the same, or may be different for each set. This makes it possible to constitute a light-emitting device that can emit light of different emission colors by switching light-emission for each set.

Furthermore, in an example in which a plurality of members are combined, the number of first light-emitting elements, the number of optical members to which the wavelength conversion members are bonded, and the number of second light-emitting elements do not need to be the same, and may take any number. For example, in accordance with the conversion efficiency of the wavelength conversion member, the number of first light-emitting elements for excitation may be made greater than the number of second light-emitting elements.

Third Embodiment

Figure 7:
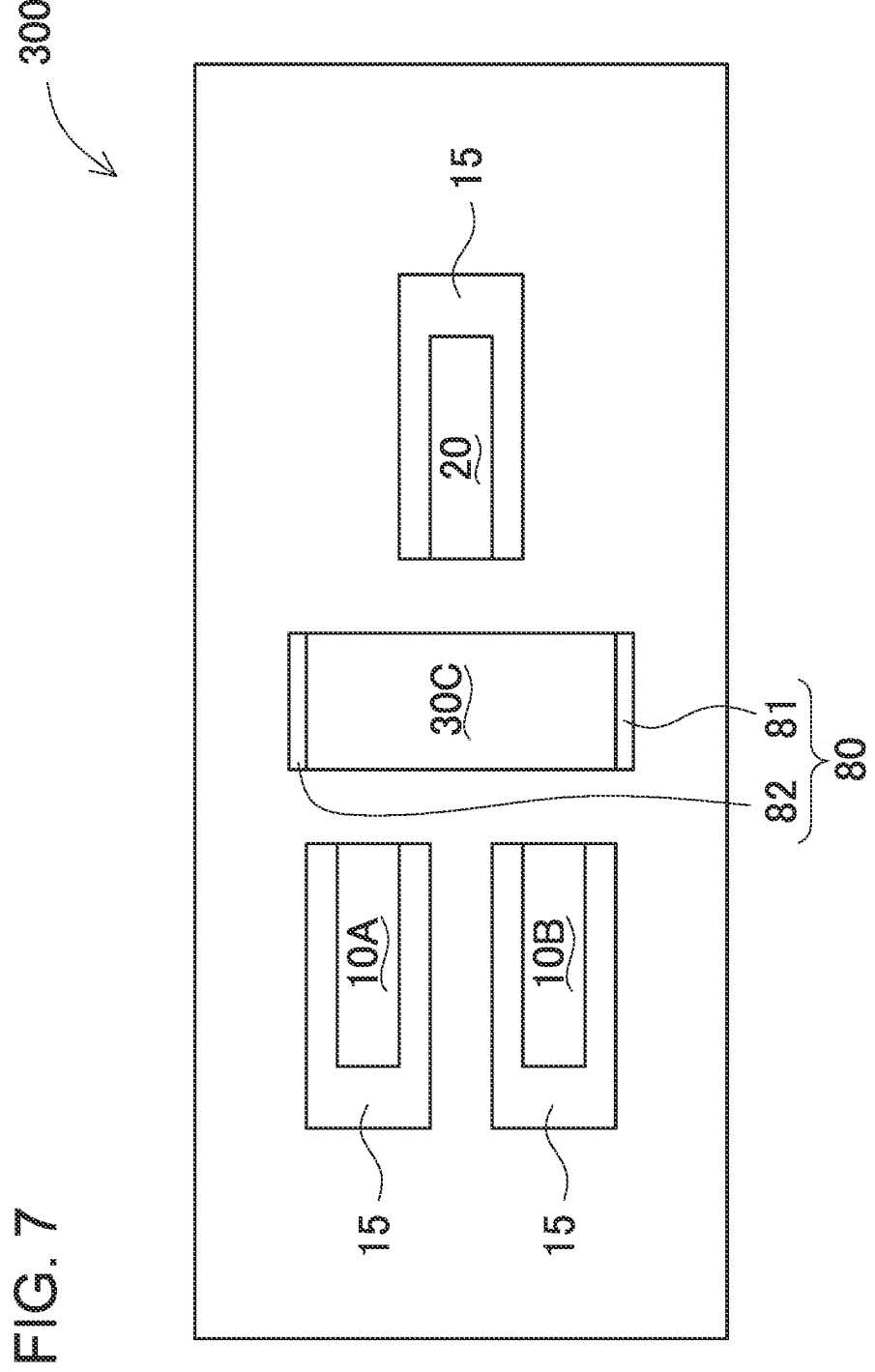
FIG. 7 is a plan view illustrating a light-emitting device according to a third embodiment of the present invention.

As an example, in a light-emitting device 300 according to a third embodiment illustrated in a plan view in FIG. 7, two first light-emitting elements 10A and 10B are arranged in parallel, and an optical member 30C bonded with the wavelength conversion member and having a size larger than or equal to a size covering first emission surfaces of the two first light-emitting elements 10A and 10B is used; on the other hand, the second light-emitting element 20 has the same size as in the first embodiment and the like. In this drawing as well, the same members as those of the above-described first embodiment and the like are denoted by the same reference signs, and detailed description thereof will be omitted. For example, when a YAG phosphor or the like containing a large amount of reddish components is used as the wavelength conversion member 40, the number of first light-emitting elements is increased in order to increase the amount of first emission light for excitation because the conversion efficiency of the phosphor is low. Even in a case of using a short-wave YAG phosphor containing a small amount of reddish components, since a DBR for cutting the short-wave side components of the phosphor is provided on the emission side to adjust color tones, the total output of the phosphor becomes low. Therefore, it is similarly necessary to increase the number of first light-emitting elements 10 for excitation.

Fourth Embodiment

Figure 8:
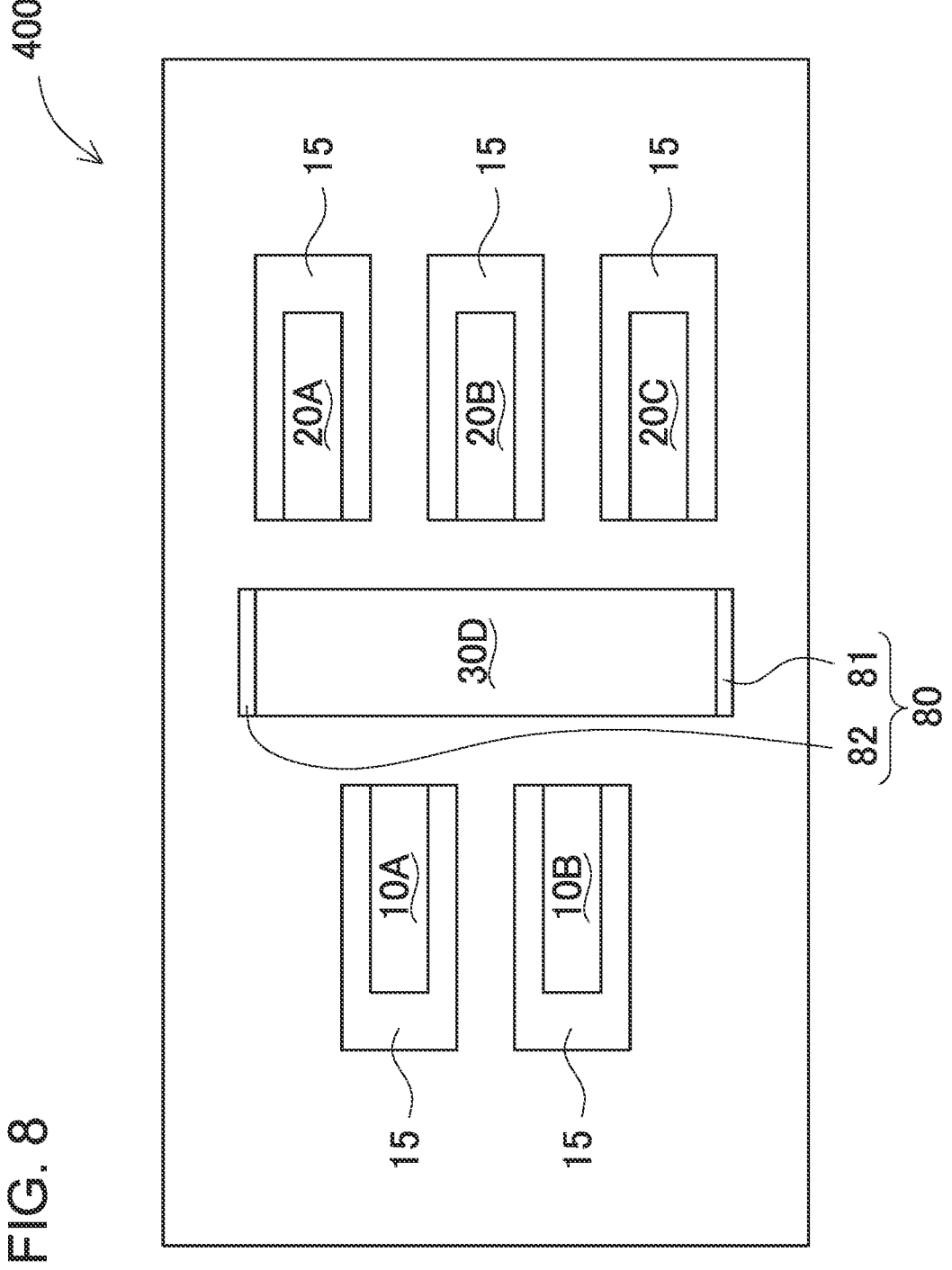
FIG. 8 is a plan view illustrating a light-emitting device according to a fourth embodiment of the present invention.

Conversely, the number of second light-emitting elements 20 may be made greater than the number of first light-emitting elements 10. Such an example is illustrated in a plan view in FIG. 8, as a light-emitting device 400 according to a fourth embodiment. In this drawing as well, the same members as those of the above-described first embodiment and the like are denoted by the same reference signs, and detailed description thereof will be omitted. In the light-emitting device 400 according to the fourth embodiment in FIG. 8, the first light-emitting element 10 has two first light-emitting elements 10A and 10B arranged in parallel to each other as in FIG. 7, while the second light-emitting element 20 has three second light-emitting elements 20A, 20B, and 20C arranged in parallel to one another. An optical member 30D bonded with the wavelength conversion member 40 and having a size larger than or equal to a size covering second emission surfaces of the three second light-emitting elements 20A, 20B, and 20C is used. For example, in a case in which light having a strong bluish component is required as in a light-emitting device used in an application such as an on-vehicle headlight, the color of light can be adjusted by increasing the number of second light-emitting elements. In this way, the number of first light-emitting elements and the number of second light-emitting elements can be designed in accordance with the required color tone, required output, and the like. In addition to changing the numbers of first light-emitting elements and second light-emitting elements, the outputs of the first light-emitting elements and second light-emitting elements may be made different. For example, high output can be achieved by using a light-emitting element with a large rated current. Furthermore, as the first light-emitting element and the second light-emitting element to be used, light-emitting elements having the same rating may be used, or light-emitting elements having different ratings may be used. However, it is preferable to use a plurality of light-emitting elements having the same rating because the control of the driver 60 may be simplified.

The light-emitting device according to each of the embodiments can be used for an illumination device such as a smart light or indirect lighting, a vehicle headlight, a head-mounted display, a projector, a display, and the like.

It should be apparent to those with an ordinary skill in the art that while various preferred examples of the invention have been shown and described, it is contemplated that the invention is not limited to the particular examples disclosed. Rather, the disclosed examples are merely illustrative of the inventive concepts and should not be interpreted as limiting the scope of the invention. All suitable modifications and changes falling within the spirit of the invention are intended to be encompassed by the appended claims.

What is claimed is:

1. A light-emitting device comprising:
   a first light-emitting element including a first light-emitting surface from which first emission light of a first emission color is emitted;
   a second light-emitting element including a second light-emitting surface from which second emission light of a second emission color is emitted;
   an optical member including an optical action layer configured to reflect or transmit light in accordance with a wavelength of the light, the optical action layer being configured to reflect the first emission light and the second emission light so that the first emission light and the second emission light do not pass through the optical action layer; and
   a wavelength conversion member configured to receive the first emission light reflected by the optical action layer of the optical member, to convert a wavelength of the first emission light, and to emit a wavelength-converted light having a converted wavelength, wherein the optical action layer of the optical member is configured to transmit the wavelength-converted light, and the optical member is arranged so that the wavelength-converted light and the second emission light without being wavelength-converted by the wavelength conversion member are emitted from an upward-facing surface of the optical action layer.

2. The light-emitting device according to claim 1, wherein the optical member further includes a light extraction surface, and the wavelength-converted light and the second emission light are emitted from the light extraction surface.

3. The light-emitting device according to claim 2, wherein the first light-emitting element and the second light-emitting element are arranged such that the first light-emitting surface and the second light-emitting surface face each other with the optical member being interposed therebetween, the optical member has a first surface, a second surface on an opposite side to the first surface, a third surface, and a fourth surface on an opposite side to the third surface, the wavelength conversion member is disposed under the first surface, the first light-emitting surface of the first light-emitting element faces the third surface, and the first emission light is incident on the third surface, the second light-emitting surface of the second light-emitting element faces the fourth surface, and the second emission light is incident on the fourth surface, the second surface is the light extraction surface, and the optical action layer extends obliquely with respect to the first surface and the third surface inside the optical member.

4. The light-emitting device according to claim 1, wherein the optical action layer of the optical member is configured to reflect light in a wavelength range of blue light and to transmit light in a wavelength range longer than the wavelength range of the blue light.

5. The light-emitting device according to claim 4, wherein the optical action layer of the optical member is configured to reflect at least light in a wavelength range from 430 nm to 480 nm and to transmit at least light in a wavelength range equal to or greater than 500 nm.

6. The light-emitting device according to claim 3, further comprising a reflection-transmission film arranged on the fourth surface of the optical member, and configured to transmit the second emission light and to reflect the wavelength-converted light having passed through the optical action layer.

7. The light-emitting device according to claim 3, further comprising:

a first reflective film configured to reflect the first emission light, the second emission light, and the wavelength-converted light; and a second reflective film configured to reflect the first emission light, the second emission light, and the wavelength-converted light, wherein the optical member includes a fifth surface intersecting the first surface, the second surface, the third surface, and the fourth surface, and a sixth surface intersecting the first surface, the second surface, the third surface and the fourth surface, and facing the fifth surface, the first reflective film is arranged on the fifth surface, and the second reflective film is arranged on the sixth surface.

8. The light-emitting device according to claim 1, wherein the first emission color and the second emission color are the same color.

9. The light-emitting device according to claim 2, wherein the first emission color and the second emission color are blue, and white light is emitted from the light extraction surface of the optical member.

10. The light-emitting device according to claim 1, wherein a difference between a main emission peak wavelength of the first light-emitting element and a main emission peak wavelength of the second light-emitting element is equal to or less than 20 nm.

11. The light-emitting device according to claim 3, wherein the second surface of the optical member includes a rough-surface region, and the second emission light is configured to pass through the rough-surface region of the second surface.

12. The light-emitting device according to claim 1, wherein each of the first light-emitting element and the second light-emitting element is a semiconductor laser element.

13. The light-emitting device according to claim 1, further comprising a driver configured to independently drive the first light-emitting element and the second light-emitting element for light emission.

14. The light-emitting device according to claim 1, further comprising a package configured to house at least the first light-emitting element, the optical member, and the second light-emitting element.

15. A light-emitting device, comprising:

a first light-emitting element including a first light-emitting surface from which first emission light of a first emission color is emitted;

a second light-emitting element including a second light-emitting surface from which second emission light of a second emission color is emitted;

an optical member including an optical action layer configured to reflect or transmit light in accordance with a wavelength of the light, the optical action layer being configured to reflect the first emission light and the second emission light so that the first emission light and the second emission light do not pass through the optical action layer; and a wavelength conversion member configured to receive the first emission light reflected by the optical action layer of the optical member, to convert a wavelength of the first emission light, and to emit a wavelength-converted light having a converted wavelength, wherein the optical action layer of the optical member is configured to transmit the wavelength-converted light, the optical member is arranged so that the wavelength-converted light and the second emission light are emitted from an upward-facing surface of the optical action layer, the optical member further includes a light extraction surface, and the wavelength-converted light and the second emission light are emitted from the light extraction surface, the first light-emitting element and the second light-emitting element are arranged such that the first light-emitting surface and the second light-emitting surface face each other with the optical member being interposed therebetween, the optical member has a first surface, a second surface on an opposite side to the first surface, a third surface, and a fourth surface on an opposite side to the third surface, the wavelength conversion member is disposed under the first surface, the first light-emitting surface of the first light-emitting element faces the third surface, and the first emission light is incident on the third surface, the second light-emitting surface of the second light-emitting element faces the fourth surface, and the second emission light is incident on the fourth surface, the second surface is the light extraction surface, the optical action layer extends obliquely with respect to the first surface and the third surface inside the optical member, and an upper end of the optical action layer does not intersect with the second surface of the optical member, and intersects with the third surface below an upper end of the third surface of the optical member.

16. The light-emitting device according to claim 1, wherein the optical action layer is a single plate having a linear cross-sectional shape.

\* \* \* \* \*